United States Patent
Kolhe et al.

(10) Patent No.: US 10,459,023 B2
(45) Date of Patent: Oct. 29, 2019

(54) SYSTEM AND METHOD TO DETERMINE STRESS LEVELS IN HARVESTING MACHINE CIRCUITS

(71) Applicant: DEERE & COMPANY, Moline, IL (US)

(72) Inventors: Atul Kolhe, Faizpur (IN); Amandeep Singh Jassal, Una (IN); Dinesh V. Phatak, Pune (IN)

(73) Assignee: DEERE & COMPANY, Moline, IL (US)

( * ) Notice: Subject to any disclaimer, the term of this patent is extended or adjusted under 35 U.S.C. 154(b) by 153 days.

(21) Appl. No.: 15/492,166

(22) Filed: Apr. 20, 2017

(65) Prior Publication Data
US 2018/0306850 A1    Oct. 25, 2018

(51) Int. Cl.
*G01R 31/00*     (2006.01)
*G01R 19/165*    (2006.01)

(52) U.S. Cl.
CPC ...... *G01R 31/007* (2013.01); *G01R 19/16571* (2013.01)

(58) Field of Classification Search
CPC .. G01R 31/007; G01R 31/40; G01R 19/0092; G01R 27/16; H02J 4/00; H02J 7/0031; H02J 7/007
See application file for complete search history.

(56) References Cited

U.S. PATENT DOCUMENTS

| 4,974,401 A | 12/1990 | Deutsch |
| 8,767,367 B2 | 7/2014 | Higuchi et al. |
| 2013/0163138 A1 | 6/2013 | Higuchi et al. |
| 2013/0253722 A1* | 9/2013 | Nakamura ......... B60R 16/0232 700/295 |
| 2016/0025789 A1 | 1/2016 | Wang et al. |
| 2016/0204597 A1 | 7/2016 | Hotta |

FOREIGN PATENT DOCUMENTS

JP    11139223 A    6/1990

* cited by examiner

*Primary Examiner* — Minh N Tang
(74) *Attorney, Agent, or Firm* — Taft Stettinius & Hollister LLP; Stephen F. Rost (57) ABSTRACT

A system and method for determining electrical stress in an electrical power system of a work vehicle. The work vehicle includes a plurality of electrical power circuits, wherein each of the electrical power circuits is operatively connected to one of a plurality of electrical devices, such as a motor. One or more controllers are each operatively connected to one or more of the plurality of devices to determine a change to an operating characteristic of the connected device. In one embodiment, a current sensor is coupled to each of the devices to sense current drawn by the device over a period of time. Each of the controllers is configured to compare the value of the sensed current to a predetermined value of current to determine a rise in temperature of the device. The determined rise in temperature is used to determine fault conditions occurring in the devices and associated wiring harnesses.

10 Claims, 5 Drawing Sheets

SYSTEM AND METHOD TO DETERMINE STRESS LEVELS IN HARVESTING MACHINE CIRCUITS

FIELD OF THE DISCLOSURE

The present invention generally relates to a harvesting machine, and more particularly to a system and method to determine stress levels in electrical circuits of a harvesting machine.

BACKGROUND

Agricultural equipment, such as a tractor or a self-propelled harvester, includes mechanical systems, electrical systems, hydraulic systems, and electro-hydraulic systems.

When harvesting cotton, for instance, cotton from cotton plants is picked by a mobile cotton harvester, which includes a header that engages the cotton plant to remove the cotton from the field. The removed cotton is delivered to a relatively large basket which receives and holds the harvested cotton. Many known cotton harvester baskets include apparatus for distributing and compacting the cotton to some extent, primarily to increase the amount of cotton which can be held in the basket.

Mobile cotton harvesters are often self-propelled cotton harvesting machines which typically come in two forms, namely a cotton stripper vehicle and a cotton picker vehicle. The cotton stripper is designed to remove the cotton bolls entirely or possibly to sever the stalk near the surface of the ground, and take the entire stalk together with cotton bolls, into the machine.

A cotton picker, on the other hand, "picks" the cotton from the bolls, typically by using revolving spindle fingers or prongs. Cotton pickers leave the cotton plant, and unopened bolls, intact, such that a given field is often harvested more than once during a growing season, the pickers making repeated trips through the cotton field as the bolls ripen.

Different types of self-propelled cotton harvesters include a bale zone, which receives the picked cotton from the basket zone, where it is compressed into bales. Once baled, a cotton bale is removed from the bale zone at a handler zone. At the handler zone, the bale is either dumped from the cotton harvester or is made available for pickup by another machine.

Self-propelled cotton harvesters can also include a cab where an operator is located to operate and/or monitor the operation of cotton harvester. The cab includes operator controls, often including a display, to provide the operator with harvester status as well as to provide operator controls for adjusting operating conditions of the harvester.

The cotton harvester further includes a vehicle propulsion system including an engine coupled to a transmission, which is in turn coupled to a drive train, as is understood by those skilled in the art.

To insure that the cotton harvester functions appropriately to efficiently pick, bale, and deliver a cotton bale, most if not all, current cotton harvesters include at least one electrical control system, including one or more controllers or processors, which are configured to provide a controlled operation according to control parameters either provided by the operator or by the control system, or both.

A majority of the control systems include electrical systems configured to pick, bale and deliver the cotton, as well as to propel the vehicle. Such control systems, however, can fail or not perform as intended due to component failures or a reduction in the performance of a component. What is needed therefore is system and method to determine the operating conditions of a harvester electrical system during operation to reduce or prevent such undesirable conditions from occurring or becoming problematic.

SUMMARY

An electronically controlled electro-hydraulic steering system is disclosed to overcome electro-hydraulic or electrical failures of a steering control system that initiate an undesired steering action.

In one embodiment of the disclosure, there is provided a method of detecting electrical stress in an electrical power system of a work vehicle. The method includes the steps of: identifying an electrical power circuit in the electrical power system; measuring an electrical parameter of the electrical power circuit at a predetermined time during operation of the electrical power circuit; comparing the measured electrical parameter to a predetermined characteristic of the electrical power circuit; and generating an alert based on the comparing, wherein the alert provides a result of the comparison to indicate that the electrical power circuit is over-stressed.

In another embodiment, there is provided a method of detecting electrical stress in an electrical power system having wiring harnesses coupled to electrical power circuits of a work vehicle. The method includes the steps of: identifying one of the electrical power circuits in the electrical power system; measuring an amount of heat generated in the wiring harness coupled to the identified electrical power circuit over a predetermined period of time during the operation of the electrical power circuit; comparing the measured amount of heat to a predetermined amount of heat experienced in the wiring harness during normal operation; and generating an alert based on the comparing step, wherein the alert indicates that the electrical power circuit is overheating.

In still another embodiment, there is provided an electrical power system configured to drive a plurality of devices of a work vehicle. The electrical power system includes a plurality of electrical power circuits, wherein each of the electrical power circuits is operatively connected to one of the plurality of devices, and a plurality of controllers. Each of the plurality of controllers includes an output operatively connected to one of the plurality of devices. A plurality of input current sensors, each of which is operatively connected to an input of one of the controllers, are each configured to determine an input current being supplied to the controller. A plurality of output current sensors, each of which is operatively connected to an output of one of the controllers, are each configured to determine an output current being supplied to the operatively connected device. At least one of the controllers is configured to store sensed input current data and sensed output current data in a memory configured to store data and program instructions.

BRIEF DESCRIPTION OF THE DRAWINGS

The above-mentioned aspects of the present invention and the manner of obtaining them will become more apparent and the invention itself will be better understood by reference to the following description of the embodiments of the invention, taken in conjunction with the accompanying drawings, wherein.

DETAILED DESCRIPTION

For the purposes of promoting an understanding of the principles of the novel invention, reference will now be made to the embodiments described herein and illustrated in the drawings and specific language will be used to describe the same. It will nevertheless be understood that no limitation of the scope of the novel invention is thereby intended, such alterations and further modifications in the illustrated devices and methods, and such further applications of the principles of the novel invention as illustrated therein being contemplated as would normally occur to one skilled in the art to which the novel invention relates.

Figure 1:
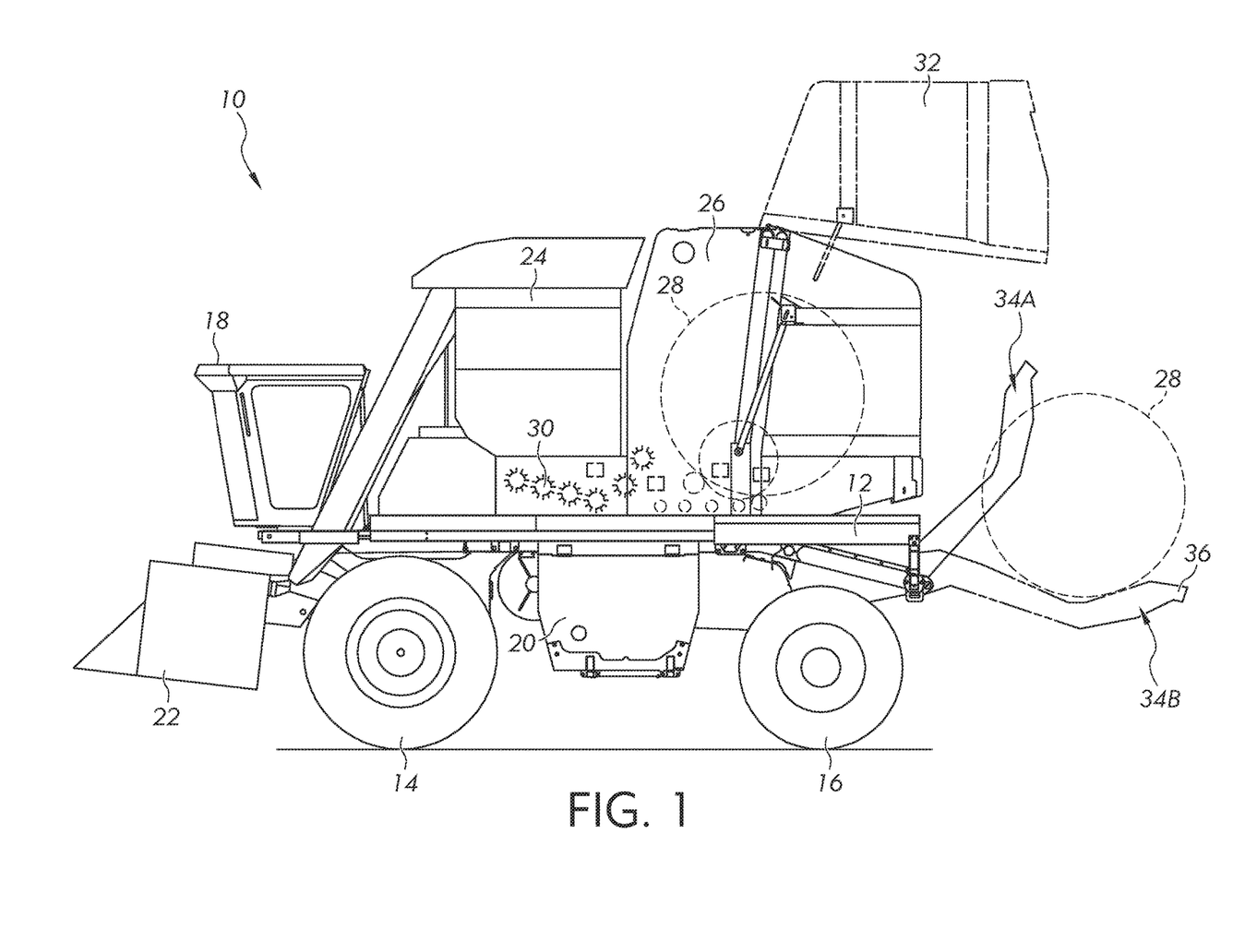
FIG. 1 is a side elevational view of a work vehicle, and more specifically, of an agricultural vehicle such as a cotton harvesting machine.

FIG. 1 is a side elevational view of an agricultural vehicle, and more particularly a cotton picker baler 10, including a frame 12 supported on a pair of front wheels 14 and a set of rear wheels 16. An operator cab 18 is mounted on the frame 12 and contains various controls for the vehicle 10 so as to be within the reach of a seated or standing operator. In one aspect, these controls may include a steering wheel and a control console including a display as would be understood by one skilled in the art. An engine 20 is mounted on the frame 12 beneath a housing and supplies power for driven components of the tractor 10. The engine 20, for example, is configured to drive a transmission (not shown), which is coupled to drive the front wheels 14 at various selected speeds and either in forward or reverse modes. In other embodiments, the rear set of wheels is driven to move the tractor, or all of the wheels are driven in an all-wheel drive configuration to move the tractor 10.

While the described embodiments are discussed with reference to a tractor, in addition to addition to agricultural vehicles, other work vehicles are contemplated including construction vehicles, forestry vehicles, lawn maintenance vehicles, as well as on-road vehicles such as those used to plow snow, spread salt, or vehicles with towing capability.

The cab 18 defines an operator workstation including a seat, which is supported by the frame 12. The operator workstation, in different embodiments, includes one or more of an operator user interface, steering wheel, a joystick, and an accelerator pedal. Pedals for a brake and a clutch are also located in the cabin 18, but are not shown.

The user interface includes a plurality of operator selectable buttons configured to enable the operator to control the operation and function of the tractor 10. The user interface, in one embodiment, includes a user interface screen or display having a plurality of user selectable buttons to select from a plurality of commands or menus, each of which are selectable through a touch screen having a display. In another embodiment, the user interface includes a plurality of mechanical push buttons as well as a touch screen. In another embodiment, the user interface includes a display screen and only mechanical push buttons.

The cotton picker baler 10 further includes a header 22, the position of which is adjustable with respect to the frame 12. The header 22 removes cotton from cotton growing in a field of cotton as the work machine 10 moves in a forward direction. A basket 24 receives the picked cotton where it is stored in sufficient quantity to enable a baler 26 to bale the cotton in a round bale 28. Cotton 30 leaves the basket 24 and moves into a baler zone where it is compressed and baled into the round bale 28. Once a bale 28 is complete, a door 32 is opened where the bale 28 exits from the baler and onto a bale handler 34. The bale handler 34 is positionable between a relatively upright position 34A and a relatively horizontal position 34B. In different embodiments, the bale handler 34 remains at position 34B where the bale is picked up by a forklift, for instance, to be moved to another location. In other embodiments, an end 36 moves to a position toward the ground where the bale falls for later processing.

Figure 2:
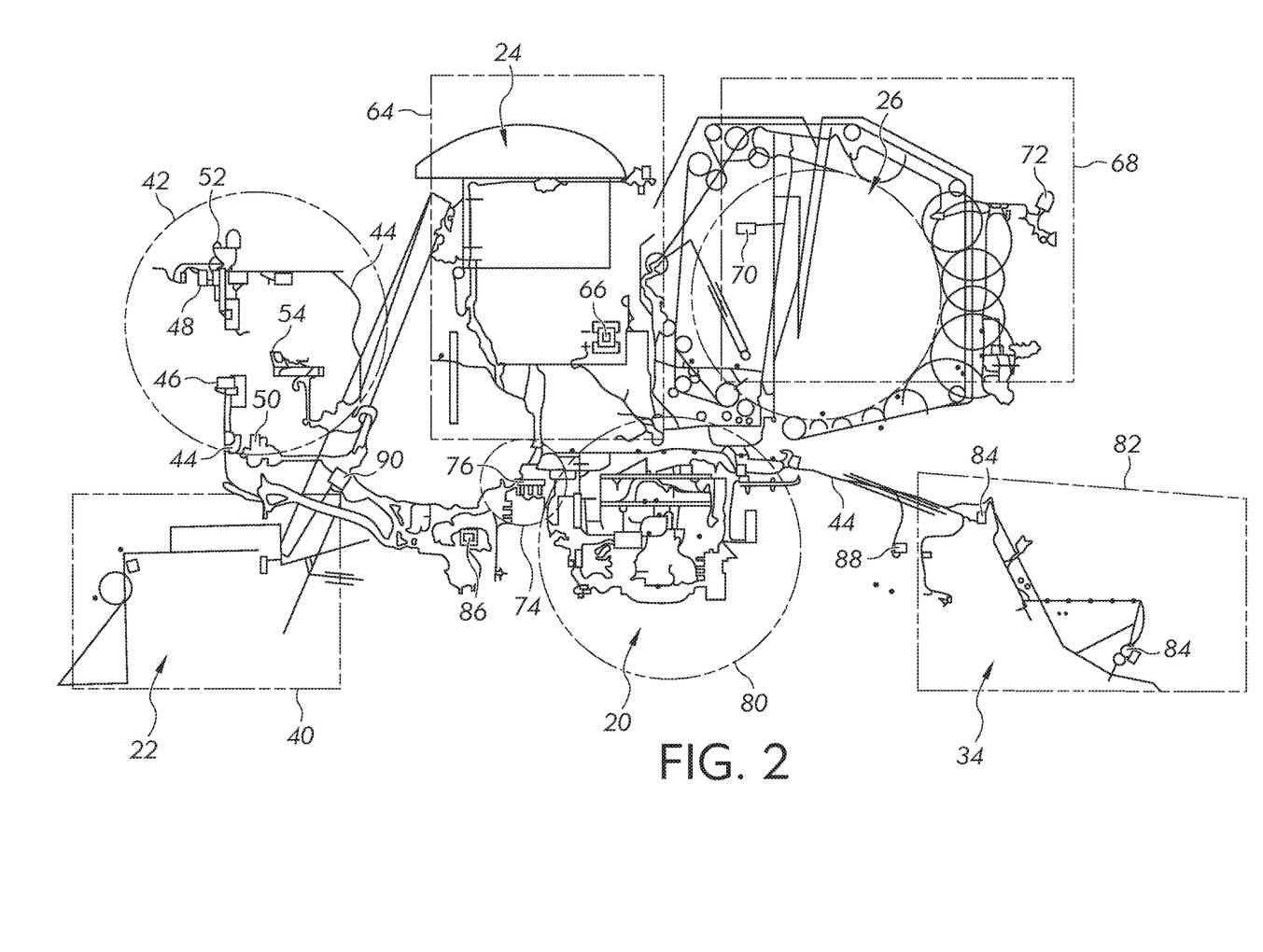
FIG. 2 is a schematic diagram of a plurality of heat zones in an agricultural work vehicle.

FIG. 2 is a schematic diagram of a plurality of heat zones in the cotton picker baler 10. While FIG. 2 illustrates heat zones of a cotton picker baler, the present invention is not limited to cotton picker balers but also applies to other types of work machines that include an electrical power system having a plurality of electrical power circuits. Each of the zones is indicated by an outline which generally illustrates a zone of heat which is generated by equipment, devices, and wiring harnesses located within the zone and which complete a predefined task. Each of the zones includes equipment and devices which provide the identified function as would be understood by those skilled in the art.

Each of the zones is defined to identify equipment and devices which contribute to the generation of heat within a particular location of the electrical power system of the vehicle. By providing defined zones, "on the fly" data analysis of key electrical parameters in the vehicle is used to predict a situation of electrical stress in the wires which is sustained for a long time. Such situations, if analyzed and captured at the time of occurrence, reduce or prevent potential loss or significant damage to the vehicle and/or to humans to improve the function and the reliability of the vehicle.

The defined zones are configured to identify and to measure electrical parameter data at a given point of time, including current and voltage values in the identified circuits. Identified and measured electrical parameter data is stored and processed against a standard set of data. A difference between the measured data and the standard date is used to determine whether a fault condition exists in the vehicle.

The cotton picker baler 10 of FIG. 1 includes a plurality of electrical power circuits, each of which is located at a predetermined location within the baler 10 and each of which generates a certain amount of heat when in operation. The electrical power circuits include, but are not limited to, power circuits for cab lights, switched 12 Volt power output, controller power inputs, valve powers, service lights, work lights, motors, recirculation fan(s), pressure fan(s), light bar lights, and load center inputs.

As seen in FIG. 1, the cotton picker 10 includes a header zone 40 located about the header 22 and a cab zone 42 located at the cab 18. The cab zone include one or more wiring harnesses 44 which are operatively connected to row finder lights and warning lights 46, a cab head light 48, a front work light 50, a lightbar light 52, and a user display 54. Each of the lights provides illumination for various tasks performed by the vehicle 10 or performed by the user, as is understood by those skilled in the art. The display 54 is located in the cab 24 for use by the operator to view current operating conditions and to adjust various devices and equipment located on the vehicle to perform crop harvesting functions.

A basket zone 64 is generally defined about the basket 24 and includes a baler controller 66 configured to operate the baler 26. The baler 26 defines a baler zone 68 which includes a work light 70 and a beacon light 72. As seen in the designation of the basket zone 64 and the baler zone 68, the identification of various devices within a zone is determined, in one or more embodiments, by the proximate location of a device to other devices and/or wiring harnesses. For instance in this embodiment, the baler controller 66 is located within the basket zone 64, but in other embodiments, the baler controller 66 is located within the baler zone 68.

A load center zone 74 is located at a load center 76, which includes a plurality of fuse blocks. In addition, the load center zone 74 includes a motor (not shown), which is a suppression water pump motor, as is understood by those skilled in the art.

An engine zone 80 is located at the engine 20. In different embodiments, the engine zone 80 includes the engine 20, as well as various devices and equipment which function with the engine to move the vehicle 10. These functions include adjusting engine operation, pollution control, sensors to monitor the operation of the engine, and other functions as is known by those skilled in the art.

A handler zone 82 is located at the handler 34. The handler zone 82 includes a tail light 84.

In some embodiments, additional equipment and devices are located outside the defined zones, but each of the additional equipment and devices are identified and monitored if desired. For instance a transmission controller 86 is operatively connected to the transmission. A backup alarm 88 provides an indication that the transmission is moving the vehicle 10 in reverse.

One or more controllers 90 are operatively coupled to devices or equipment within each of the zones to provide for control of the devices or equipment, including monitoring and control of equipment and of devices.

Figure 3:
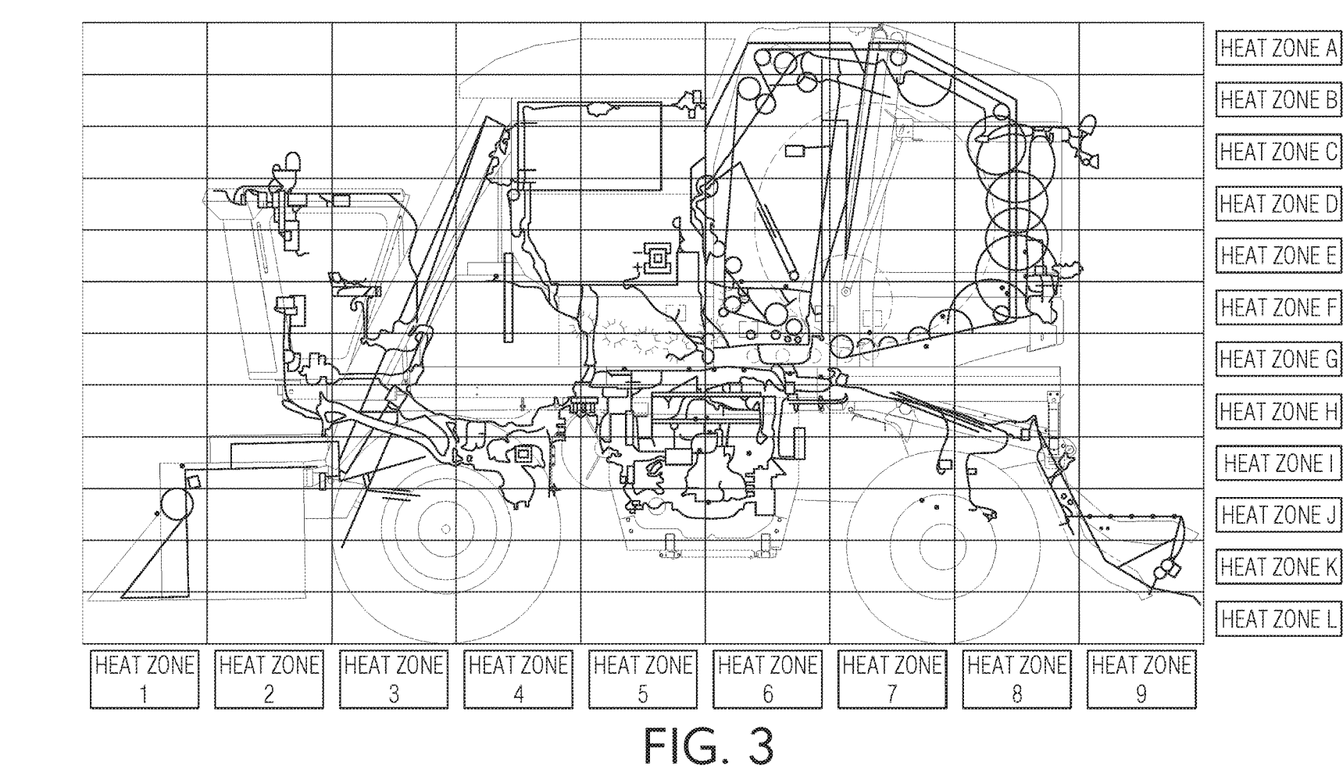
FIG. 3 is a schematic diagram of a two-dimensional grid arranged to define a plurality of heat zones of a work vehicle.

While the zones each appear to be a two-dimensional zone in the illustrated embodiment of FIG. 2, each of the zones is a three dimensional zone configured to include devices and equipment throughout all portions of the vehicle which provide functions for a particular zone. In addition, while each of the zones of FIG. 2 is associated with a particular function or functions provided by the vehicle 10, each of the zones, in different embodiments, is defined in other configurations to be directed to individual devices. In on such embodiments, the zones are definable as a two-dimensional grid such as is shown in FIG. 3. The zones of FIG. 3 are reduced in size to enable an identification of specific devices and equipment.

Figure 4:
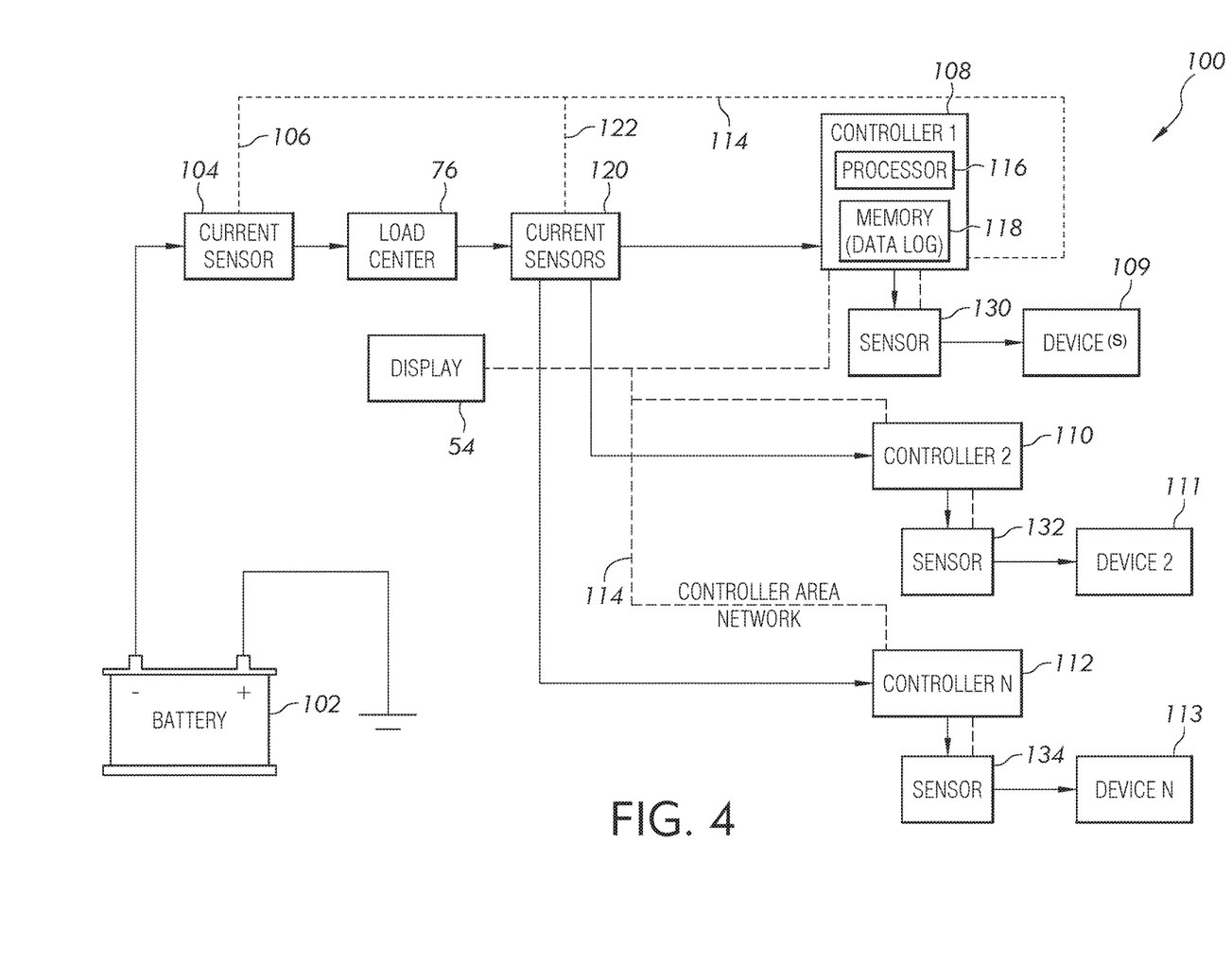
FIG. 4 is a schematic block diagram of an electrical power system of an agricultural work vehicle.

FIG. 4 illustrates an electrical power system 100 of the vehicle 10 which is configured to determine a location of any electrical faults occurring in the vehicle 10. For instance, during an event of a short circuit or a load change, excessive current passes through the electrical circuits. If such faults occur often enough, permanent damage to the insulating materials of wires can occur, which can increase the risk of a failure.

As illustrated in FIG. 4, electrical parameters, including current and/or voltage are measured dynamically, i.e. during operation, at a given point in time. The temperature zones and the wiring harness resistance parameters are pre-defined. One or more controllers, locate irregularities in one or more wiring harnesses based on the identified data. The data enables the detection of a sudden increase in wiring harness current or voltage and is used to reduce or prevent subsequent problems. In one embodiment, I squared ($I^2$) R losses are used to identify the rate of rise of temperature in the wires.

A battery 102 provides electrical power in the form of a current and voltage to the load center 76 through a current sensor 104. The current sensor 104 is adapted to determine the amount of current being drawn from the battery 102 during operation of the vehicles. The current sensor 104 provides an output 106 which is operatively connected to a first controller 108. The first controller 108 is coupled to one or more devices 109 to provide control functions therefore. In other embodiments, the first controller 108 is coupled to each one of the multiple devices 109, where each of the devices is coupled to a dedicated sensor configured to sense the current supplied to a specific device. In another embodiment, the first device 109 is an assembly, which includes multiple devices, wherein a single sensor is used to determine the current provided to the entire assembly.

A second controller 110 is coupled to a device 111 to provide control functions and an $N^{th}$ controller 112 is coupled to a device 113 to provide control functions. The electrical power system 100 includes one or more of the controllers and consequently the $N^{th}$ controller 112 indicates that the number is variable depending on the vehicle. The controllers process sensed data. In another embodiment, a single controller is provided to perform all functions of the vehicle. The controllers of FIG. 4 generally correspond to the controllers 90 of FIG. 2.

Each of the controllers 108, 110, and 112 is electrically coupled to a controller area network (CAN) 114 and to the display 54. In this configuration, each of the controllers cooperates with one or more of the other controllers to control vehicle functions. Each of the controllers is also configured to provide information for display at the display 54. In some embodiments, one or more of the controllers transmits a coded or un-encoded message to the display for review by the operator. In some embodiments, the display includes a touch screen display to provide operating instructions, under direction of the operator, to one or more of the controllers to direct the operation of the devices or equipment. In one embodiment, the display is configured as user interface to provide different types of information to the operator.

In other embodiments, manual control devices are coupled to one or more of the controllers (not shown) to control the operation of the devices and/or equipment. In other embodiments, a master controller, such as controller 108, is provided to monitor and control the operation of the remaining controllers.

In one embodiment, each of the controllers includes a processor 116 and a memory 118, such as is illustrated for the controller 108. While the memory 118 is shown as being part of the controller 108, in different embodiments, the memory is separate from the controller. One of more memories in different embodiments is used and each of the controllers is configured to communicate with one or more of the memories.

The load center 76 is an electrical current distribution center, which includes a plurality of fuse blocks. A power cable from battery main fuse block is connected to an input bus bar of the fuse center. This bus bar is further connected to various power outlets through each of the fuses. At one or more of these power outlets, current sensors 120 are electrically coupled to determine the amount of current being drawn through each of the power outlets. Each of the current sensors 120 includes an output 122 which is electrically coupled to the controller 108 to provide a value of the sensed current to the controller 108.

Each of the current sensors 120 is further electrically coupled to the respective controllers 1-N, as illustrated in FIG. 4, to determine an amount of current being drawn by the controller. Each of the outputs is also coupled to the respective controller to provide a value of the sensed current drawn by the controller.

Controller 108 is operatively connected to the device 109 through an output sensor 130 which is adapted to determine the current drawn by the connected device. Each of the remaining controllers is coupled to the respective device by an output sensor. For instance, an output sensor 132 is coupled to the controller 110 and the device 111 to determine current drawn by the devices. An output sensor 134 is likewise coupled to the controller N 112 and the device N 113. The input controller current and the output controller current are measured by the associated current sensor. In different embodiments, the input current sensors and output current sensors are part of the controller itself or are separate sensors distinct from the controller. The parameters for the dynamic current are measured at a controller input and a controller output. The controller output is measured for a period of time that the current is supplied for the connected device.

Each of the controllers monitors and/or controls the performance of the operations described herein. Additional functions are also provided in different embodiments, including vehicle location, vehicle direction, and time of day. The processor of each of the controllers is of a programmable variety that executes algorithms and processes data in accordance with the processor operating logic as defined by programming instructions (such as software or firmware) stored in the memory. Alternatively or additionally, the operating logic for the processor is at least partially defined by hardwired logic or other hardware. The processor can be comprised of one or more components of any type suitable to process the signals received from connected devices or sensors, and provides a desired output signal. Such components include digital circuitry, analog circuitry, or a combination of both.

The memory, in different embodiments, is of one or more types, such as a solid-state variety, electromagnetic variety, optical variety, or a combination of these forms. Furthermore, the memory is volatile, nonvolatile, or a combination of these types, and some or all of memory includes the use of a portable variety, such as a disk, tape, memory stick, cartridge, or the like. In addition, the memory stores data that is manipulated by the processor, such as data representative of signals received from a sensor, a device or sent a device. Software instructions or programming instructions define the operation of the controller.

Figure 5:
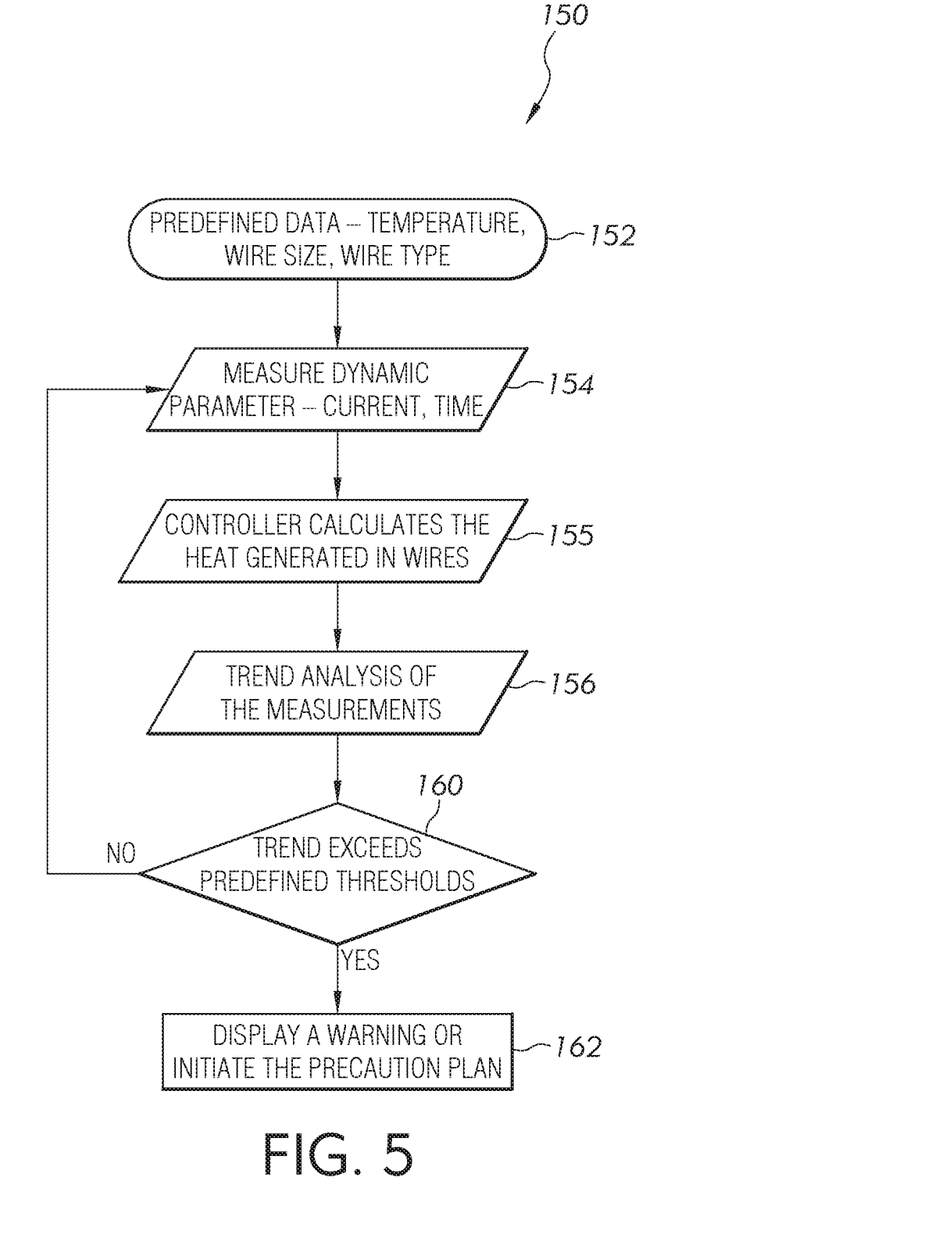
FIG. 5 is a process block diagram of a control system configured to determine an amount of heat generated in a heat zone.

FIG. 5 is a process block diagram 150 of a control system configured to determine an amount of heat generated within one or more of the heat zones. In one embodiment of the process, the electrical parameters are measured over a period of time, also identified as a dynamic measurement of the electrical parameters. One or more of the controllers calculates the heat generated in each of the electrical power circuits by the use of controller software and a database of the predefined parameters located in memory. The calculated electrical parameters are stored as a data log to provide a time based log of the changes to the determined electrical parameters over a period of time. These electrical parameters are then stored in memory accessible by one or more of the controllers, or by a central controller, to generate a trend analysis. The size of the trend table is configured, in one embodiment, based on various parameters affecting the decision making with regard to the occurrence of a fault.

Initially, a set of predefined data, which includes but is not limited to, wire size, wire type, and predetermined temperature calculations of the wire based on the characteristics of the wire is determined at block 152. The predefined data is stored in a memory for access by the one or more controllers. Once the vehicle is in operation, the various described sensors provide continuous readings of current to the one or more controllers. This dynamic parameter, in one embodiment, is the measured current over a period of time as determined at block 154. This data is stored in one or more of the memories and is accessible by one or more of the controllers. In different embodiments, the current is sensed a predetermined number of times over a predetermined period of time. For instance, the current is sensed five times per second over a predetermined period of time of thirty seconds. Other numbers and time periods are contemplated.

Once stored, one or more of the controllers calculate the heat generated in the wires at block 155. The calculated generated heat is stored in memory as a table. In different embodiments, the size of the trend table is configurable based on the various parameters affecting a determination of heat generation. A trend analysis of the stored measured parameters is performed to determine a change in measured parameters over time at block 156.

In one embodiment, the trend analysis is determined by storing the sensed current values over a predetermined period of time, determining a temperature for each of the sensed current values, and comparing the determined temperatures to a threshold temperature value. If one or more of the determined temperatures exceeds the threshold, then a warning or an alert is provided.

In one aspect, if the determined temperature exceeds the threshold temperature one time, the warning is provided. In another aspect, the warning is not provided unless the determined temperature exceeds the threshold temperature two or more times during the predetermined time period. For example, if the determined temperature exceeds the threshold temperature three times during a thirty second period of time, only then is the warning displayed.

In still another embodiment, the determined temperatures are stored and averaged over a predetermined period of time. The average of the determined temperatures is then compared to a predetermined temperature, which if exceeded triggers a warning.

The trend analysis is analyzed by the controller to determine whether the trend indicates that a possible fault condition exists. In another embodiment, the trend analysis is continually used to determine an amount of heat generated.

The calculated amount of heat generated is determined by one or more of the controllers, depending on the system configuration, wherein the controller is configured to execute the stored program instructions to determine the amount of heat generated by the operatively connected device using the formula:

$$H \alpha I^2 \times R \times t$$

(where H=Heat generated in Joules, I=Current Flowing, R=Resistance, and t=Time) and $$H = 1/j \times I^2 \times R \times t$$

(where j is equal to Joule's mechanical equivalent (constant) of wire)

Once the generated heat is calculated and the trend analysis is made, the controller determines if the trend indicates that the amount of heat is trending toward an unacceptable level. The trend is compared to one or more predefined thresholds at block 160 to determine if the trend, i.e. the generated heat, presents a problem. The calculated generated heat is compared to a table of acceptable heat values to determine if the generated heat is unacceptable at block 160. If the generated heat is not significant, i.e. acceptable, the process returns to block 154 to continue the measurement of the dynamic parameters in the wires.

If, however, the heat is unacceptable, the process proceeds to block 162 where a warning is displayed or a precaution plan is initiated. If the controller detects that the heat generated in particular circuit is more than the predefined circuit maximum limit, a warning is displayed on the display 54. In one embodiment, if the detected heat is in a critical range and is considered to be significant, a precaution plan is automatically initiated by system controller. For instance, the precaution plan includes predefined corrective actions to reduce or eliminate any damage which could result from the excessive heat. As an example, should excessive heat develop in the baler zone 68, the responsible controller provides a warning to the display 54 and shuts down the operation of the baler 26. Further use of the baler 26 is prevented until the electrical power system is reset by the operator or a technician after fault is corrected. In other embodiments, the warning includes an alarm, which provides an audible warning, or a flashing or colored light indicating a problem.

In another embodiment, the sensed current is compared to a threshold current to determine if excess heat is being generated. In this embodiment, the values of the sensed current are predetermined to indicate an amount of heat being generated. A lookup table associates sensed current with heat generation.

As described herein, the present disclosure improves the operation of work vehicles that are manufactured to include higher levels of electrical complexity and high current/voltage applications. The disclosed system and method increases the safety of the vehicle and to the operators by providing the information of fault conditions prior to an actual failure.

The electrical parameter dynamic measurement system detects irregularities in wiring harnesses to reduce or to prevent excessive wire heating and insulation melting incidents which, if not remedied, can result in severe failures.

While exemplary embodiments incorporating the principles of the present disclosure have been described hereinabove, the present disclosure is not limited to the described embodiments. Instead, this application is intended to cover any variations, uses, or adaptations of the disclosure using its general principles. Further, this application is intended to cover such departures from the present disclosure as come within known or customary practice in the art to which this disclosure pertains and which fall within the limits of the appended claims.

The invention claimed is:

1. An electrical power system configured to drive a plurality of devices of a work vehicle, the electrical power system comprising:
a plurality of electrical power circuits, wherein each one of the electrical power circuits is operatively connected to a different one of the plurality of devices;
a plurality of controllers, wherein each one of the controllers is operatively connected to a different one of the plurality of devices and includes an output operatively connected to the operatively connected one of the plurality of devices;
a plurality of input current sensors, each one of which is operatively connected to an input of a different one of the controllers, wherein each of the plurality of input current sensors is configured to determine an input current being supplied to the controller;
a plurality of output current sensors, each one of which is operatively connected to an output of a different one of the controllers and is configured to determine an output current being drawn by the operatively connected device through the operatively connected controller, wherein at least one of the plurality of controllers is configured to store sensed input current data and sensed output current data in a memory configured to store data and program instructions.

2. The electrical power system of claim 1 wherein the at least one of the plurality controllers is configured to execute the stored program instructions to:
compare the sensed input current data and the sensed output current data to standard data located in a database stored in the memory, wherein the standard data is representative of a standard set of operating characteristics for each of the plurality of controllers.

3. The electrical power system of claim 2 wherein the at least one of the plurality of controllers is configured to execute the stored program instructions to determine a period of time over which the sensed output data is being supplied to the operatively connected device of one of the plurality of devices.

4. The electrical power system of claim 3 wherein the at least one of the plurality of controllers is configured to execute the stored program instructions to determine an amount of heat generated by the operatively connected device of one of the plurality of devices using the formula:

$$H = 1/j \times I^2 \times R \times t$$

5. The electrical power system of claim 3 wherein the sensed output data includes a current, and the at least one of the plurality of controllers is configured to execute the stored program instructions to determine a change in the current value over a period of time.

6. The electrical power system of claim 5 wherein the period of time is predetermined period of time.

7. The electrical power system of claim 5 wherein the period of time is determined as a time period between when one of the electrical power circuits starts to draw current and the one of the electrical power circuits stops drawing current.

8. The electrical power system of claim 2 wherein the at least one of the plurality of controllers is configured to execute the stored program instructions to store results of the comparison of the sensed input current data and the sensed output current data.

9. The electrical power system of claim 2 wherein the at least one of the plurality of controllers is configured to execute stored program instructions to determine an amount of heat generated by each of the plurality of electrical power circuits.

10. The electrical power system of claim 9 wherein the at least one of plurality of controllers is configured to execute stored program instructions to provide an indicator that the determined amount of heat exceeds a predetermined limit.

* * * * *